(12) United States Patent
Hayakawa et al.

(10) Patent No.: US 9,444,223 B2
(45) Date of Patent: Sep. 13, 2016

(54) SURFACE-EMITTING SEMICONDUCTOR LASER DEVICE AND METHOD FOR PRODUCING THE SAME

(71) Applicant: FUJI XEROX CO., LTD., Tokyo (JP)

(72) Inventors: Junichiro Hayakawa, Kanagawa (JP); Masaya Kumei, Kanagawa (JP); Akemi Murakami, Kanagawa (JP); Takashi Kondo, Kanagawa (JP); Kazutaka Takeda, Kanagawa (JP); Jun Sakurai, Kanagawa (JP)

(73) Assignee: FUJI XEROX CO., LTD., Tokyo (JP)

(*) Notice: Subject to any disclaimer, the term of this patent is extended or adjusted under 35 U.S.C. 154(b) by 0 days.

(21) Appl. No.: 14/803,244

(22) Filed: Jul. 20, 2015

(65) Prior Publication Data

US 2016/0118773 A1   Apr. 28, 2016

(30) Foreign Application Priority Data

Oct. 22, 2014   (JP) .................................. 2014-215421

(51) Int. Cl.
| H01S 5/22 | (2006.01) |
|---|---|
| H01S 5/183 | (2006.01) |
| H01S 5/042 | (2006.01) |

(52) U.S. Cl.
CPC ............ *H01S 5/2202* (2013.01); *H01S 5/0425* (2013.01); *H01S 5/18308* (2013.01); *H01S 5/18344* (2013.01)

(58) Field of Classification Search
CPC . H01S 5/2202; H01S 5/0425; H01S 5/18308
See application file for complete search history.

(56) References Cited

FOREIGN PATENT DOCUMENTS

| JP | 2007-173513 | * | 7/2007 |
|---|---|---|---|
| JP | 2011-114227 A | | 6/2011 |
| JP | 4946041 B2 | | 6/2012 |

* cited by examiner

*Primary Examiner* — Dung Nguyen
(74) *Attorney, Agent, or Firm* — Sughrue Mion, PLLC

(57) ABSTRACT

Provided is a surface-emitting semiconductor laser device including a substrate; a semiconductor layer formed on the substrate, the semiconductor layer including a first semiconductor multilayer film of a first conductivity type, an active region, and a second semiconductor multilayer film of a second conductivity type, the first semiconductor multilayer film and the second semiconductor multilayer film forming a cavity; and an oxidation-resistant structure including a groove formed along at least a portion of an outer periphery of the semiconductor layer and an oxidation-resistant portion formed on a surface of the groove.

15 Claims, 9 Drawing Sheets

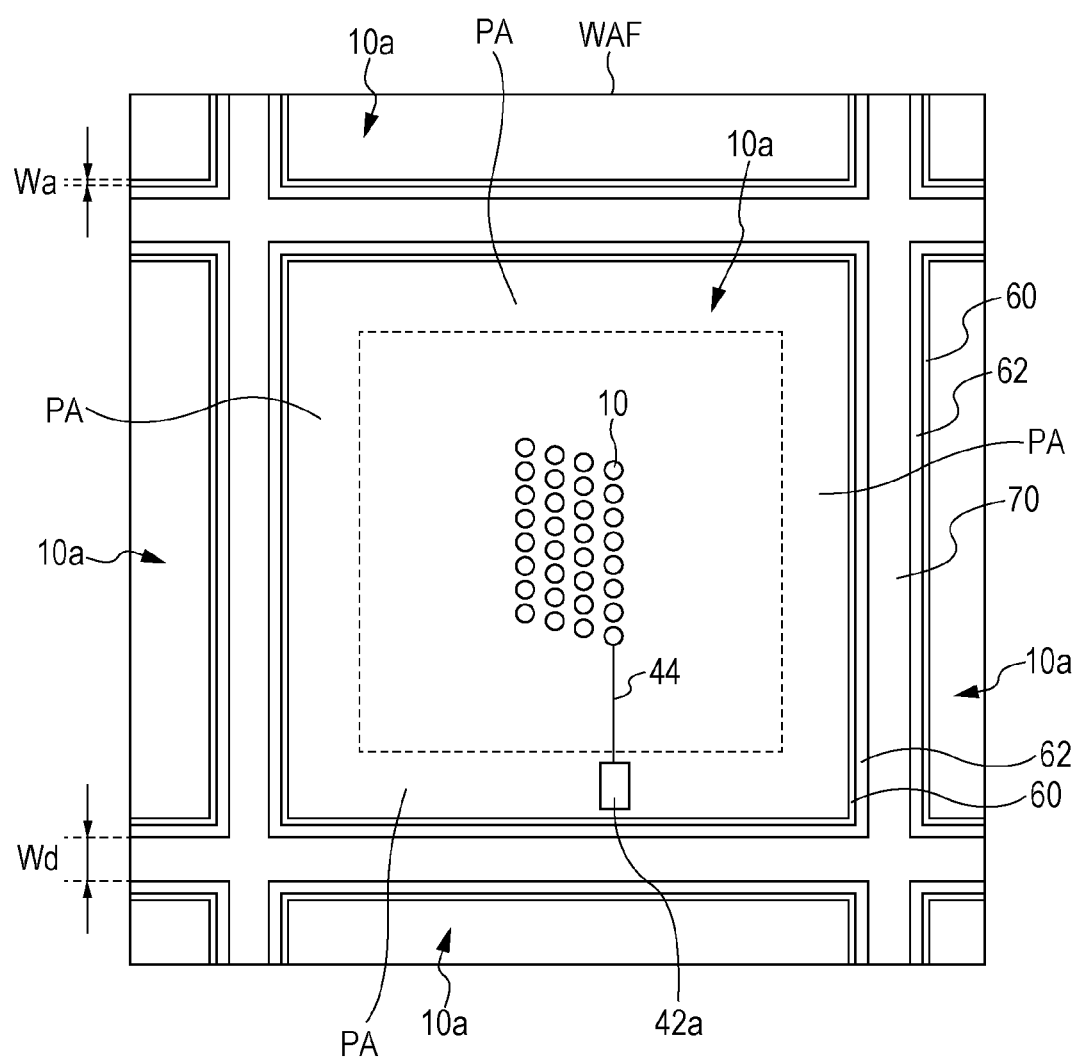

US 9,444,223 B2

SURFACE-EMITTING SEMICONDUCTOR LASER DEVICE AND METHOD FOR PRODUCING THE SAME

CROSS-REFERENCE TO RELATED APPLICATIONS

This application is based on and claims priority under 35 USC 119 from Japanese Patent Application No. 2014-215421 filed Oct. 22, 2014.

BACKGROUND

Technical Field

The present invention relates to a surface-emitting semiconductor laser device and a method for producing the surface-emitting semiconductor laser device.

SUMMARY

According to an aspect of the invention, there is provided a surface-emitting semiconductor laser device including a substrate; a semiconductor layer formed on the substrate, the semiconductor layer including a first semiconductor multilayer film of a first conductivity type, an active region, and a second semiconductor multilayer film of a second conductivity type, the first semiconductor multilayer film and the second semiconductor multilayer film forming a cavity; and an oxidation-resistant structure including a groove formed along at least a portion of an outer periphery of the semiconductor layer and an oxidation-resistant portion formed on a surface of the groove.

BRIEF DESCRIPTION OF THE DRAWINGS

Exemplary embodiments of the present invention will be described in detail based on the following figures, wherein:

FIG. 3 is a plan view of a wafer of a surface-emitting semiconductor laser array according to the first exemplary embodiment;

DETAILED DESCRIPTION

Exemplary embodiments of the invention are described in detail below with reference to the attached drawings.

First Exemplary Embodiment

Figure 1:
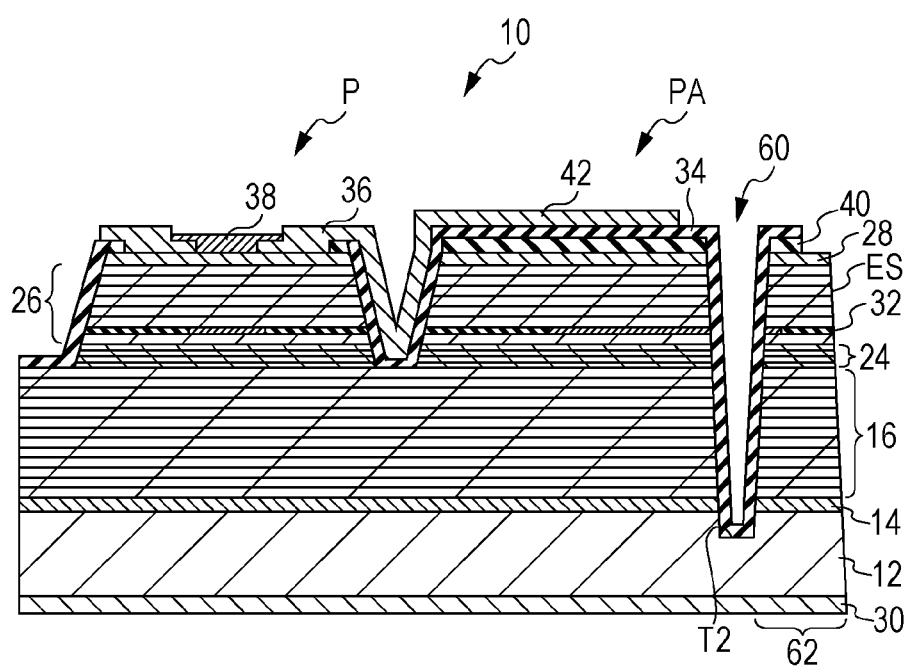
FIG. 1 is a longitudinal sectional view of an example of a surface-emitting semiconductor laser device according to the first exemplary embodiment.

FIG. 1 is a longitudinal sectional view of an example of a surface-emitting semiconductor laser (i.e., vertical cavity surface-emitting laser (VCSEL), and the surface-emitting semiconductor laser is referred to as "VCSEL" hereinafter)) device 10 according to the first exemplary embodiment. In the first exemplary embodiment, a GaAs-based surface-emitting semiconductor laser device including an n-type GaAs substrate is described as an example. However, the type of surface-emitting semiconductor laser device is not limited to this and may alternatively be a surface-emitting semiconductor laser device composed of an InGaAsP-based material, an AlGaInP-based material, an InGaN/GaN-based material, or the like. The conductivity type of the substrate is not limited to n-type and may alternatively be p-type. In such a case, the term "n-type" in the following description should be read as "p-type".

As illustrated in FIG. 1, the VCSEL device 10 according to the first exemplary embodiment includes a post P, a pad formation region PA, an oxidation-resistant structure 60, and an oxidation sacrificial region 62. The post P is a mesa-like light-emitting portion. The pad formation region PA is a region in which an electrode pad 42 is to be formed. The oxidation-resistant structure 60 is a structure that eliminates or reduces the risk that the side surfaces and the inside of the VCSEL device 10 may be oxidized. The oxidation sacrificial region 62 is provided in order to tolerate oxidation of the side surfaces of the VCSEL device 10 and avoids the inside of the VCSEL device 10 from being oxidized in cooperation with the oxidation-resistant structure 60.

As illustrated in FIG. 1, the post P, the pad formation region PA, and the oxidation sacrificial region 62 of the VCSEL device 10 include plural semiconductor layers in common. Specifically, the VCSEL device 10 includes an n-type GaAs buffer layer 14 stacked on an n-type GaAs substrate 12, a lower distributed Bragg reflector (hereinafter, abbreviated as "DBR") 16 stacked on the buffer layer 14, an active region 24 stacked on the lower DBR 16, an AlAs layer 32 stacked on the active region 24, an upper DBR 26 stacked on the AlAs layer 32, and a p-type GaAs contact layer 28 stacked on the upper DBR 26. The interface between the lower DBR 16 and the active region 24 and the interface between the upper DBR 26 and the active region 24 form a cavity.

A silicon oxynitride (SiON) film 34 serving as an insulating film is deposited in the periphery of the semiconductor layers including the mesa structure. A p-type electrode 36 is disposed on the semiconductor layers with the silicon oxynitride film 34 interposed therebetween. The p-type electrode 36 is connected to the p-type GaAs contact layer 28 so as to be in ohmic contact with the p-type GaAs contact layer 28. The p-type electrode 36 is formed by, for example, depositing a titanium (Ti)/gold (Au) laminated film. It should be noted that the silicon oxynitride film is merely an example of an insulating film and the insulating film may alternatively be composed of another material such as silicon nitride (SiN).

An n-type electrode 30 is disposed on the other side of the n-type GaAs substrate 12, which is opposite to the side on which the above-described semiconductor layers are stacked. The n-type electrode 30 is formed by, for example, depositing an AuGe (alloy of gold and germanium)/Au laminated film.

In the pad formation region PA and the oxidation sacrificial region 62, a silicon nitride film 40 is interposed between the p-type GaAs contact layer 28 and the silicon oxynitride film 34. An emission protection film 38, which is disposed on the p-type GaAs contact layer 28, protects a light-emitting surface.

In the first exemplary embodiment, the n-type GaAs substrate 12 is, for example, a silicon (Si)-doped GaAs substrate.

The n-type GaAs buffer layer 14 composed of, for example, Si-doped GaAs, which is stacked on the n-type GaAs substrate 12, improves the crystallinity of the surface of the substrate that has been subjected to thermal cleaning.

The n-type lower DBR 16, which is stacked on the n-type GaAs buffer layer 14, is a multilayer-film reflector including alternating pairs of semiconductor layers having a thickness of $0.25\lambda/n$ and different refractive indices, where $\lambda$ represents the oscillation wavelength of the VCSEL device 10 and n represents the refractive index of the medium (i.e., semiconductor layer). Specifically, the lower DBR 16 includes alternating pairs of an n-type low-refractive-index layer composed of Si-doped $Al_{0.9}Ga_{0.1}As$ and an n-type high-refractive-index layer composed of Si-doped $Al_{0.3}Ga_{0.7}As$. The oscillation wavelength $\lambda$ of the surface-emitting semiconductor laser device 10 according to the first exemplary embodiment is set to, for example, 780 nm.

In the first exemplary embodiment, the active region 24 includes, in order from closest to the n-type GaAs substrate 12, a lower spacer layer, a quantum well active layer, and an upper spacer layer that are stacked on top of one another. In the first exemplary embodiment, the quantum well active layer includes four $Al_{0.3}Ga_{0.7}As$ barrier layers and three $Al_{0.11}Ga_{0.89}As$ quantum well layers each interposed between the corresponding pair of the barrier layers. The lower and upper spacer layers, which are interposed between the quantum well active layer and the lower DBR 16 and between the quantum well active layer and the upper DBR 26, respectively, enable the length of the cavity to be controlled and also serve as cladding layers within which carriers are confined.

The p-type AlAs layer 32, which is stacked on the active region 24, serves as a current confinement layer and includes a current injection region 32a and a selective oxidation region 32b. A current that passes from the p-type electrode 36 to the n-type electrode 30 is concentrated through the current injection region 32a.

The upper DBR 26, which is stacked on the AlAs layer 32, is a multilayer-film reflector including alternating pairs of semiconductor layers having a thickness of $0.25\lambda/n$ and different refractive indices. Specifically, the upper DBR 26 includes alternating pairs of a p-type low-refractive-index layer composed of carbon (C)-doped $Al_{0.9}Ga_{0.1}As$ and a p-type high-refractive-index layer composed of C-doped $Al_{0.3}Ga_{0.7}As$.

VCSEL devices such as the one described above are capable of emitting a laser beam in a direction perpendicular to the substrate and easy to be arranged in an array by two-dimensional integration. Therefore, the VCSEL devices have been used as a light source for optical communication or electronic equipment, such as a light source for a writing unit of an electrophotographic system, a light source for drying ink, or a light source for machining.

The VCSEL device includes a pair of distributed Bragg reflectors (i.e., lower DBR 16 and upper DBR 26) stacked on the semiconductor substrate (i.e., n-type GaAs substrate 12); and an active layer (i.e., quantum well active layer) and cavity spacer layers (i.e., lower and upper spacer layers) that are interposed between the pair of distributed Bragg reflectors. When a current is injected into the active layer via electrodes (i.e., p-type electrode 36 and n-type electrode 30) disposed on the respective distributed Bragg reflectors, lasing of the VCSEL device occurs in a direction perpendicular to the substrate, and the oscillated light is emitted from the upper part (i.e., p-type GaAs contact layer 28 side) of the VCSEL device.

In order to lower the threshold current and control the transverse mode, the VCSEL device further includes an oxidation confinement layer (i.e., AlAs layer 32), which is formed by oxidizing a semiconductor layer containing aluminium (Al). The oxidation confinement layer is formed by forming the epitaxially grown semiconductor layers into a mesa-like shape by etching to form a post P and intentionally oxidizing the side surfaces of the post P.

When the VCSEL device prepared in the above-described manner is separated from one another by dicing, the side surfaces of the semiconductor layers are exposed. That is, in this state, the side surfaces of the semiconductor layers are exposed to the outside air. Consequently, the semiconductor layers may be oxidized unintentionally from the exposed side surfaces of the semiconductor layers, which leads to degradation of the semiconductor layers over time. Specifically, peeling of an insulating film and breaking of metal wires may occur. These phenomena are particularly noticeable under high-temperature, high-humidity conditions.

Figure 9:
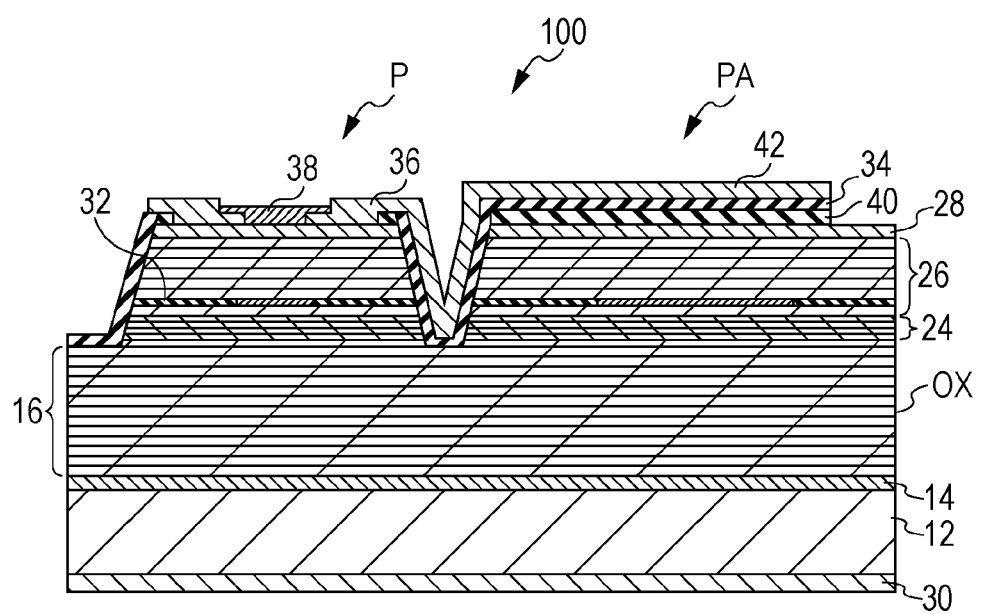
FIG. 9 is a longitudinal sectional view of a surface-emitting semiconductor laser device according to the related art.

The phenomena are described taking, as an example, a VCSEL device 100 according to the related art illustrated in FIG. 9. The VCSEL device 100 does not include components that correspond to the oxidation-resistant structure 60 and the oxidation sacrificial region 62 of the VCSEL device 10 according to the first exemplary embodiment. The other components of the VCSEL device 100 are similar to those of the VCSEL device 10. Thus, the similar components are designated by the same reference numerals in FIG. 9.

In the VCSEL device 100, an unintended oxidized region OX is present in a layer that is directly connected to the post P as illustrated in FIG. 9. It should be noted that FIG. 9 illustrates an example where the lower DBR 16 is oxidized, but oxidation may occur in a semiconductor layer other than the lower DBR 16, such as the upper DBR 26 or the active region 24.

In order to address the above-described phenomenon, there has been known an oxidation-resistant structure in which a groove is formed in a dicing region (i.e., separating region) and the surface of the dicing region which is exposed at the groove is covered with an insulating film. In this oxidation-resistant structure, dicing is done along the groove subsequent to formation of the oxidation-resistant structure. Therefore, the width of the groove of the oxidation-resistant structure needs to be larger than the width of the groove which is required for dicing, which results in an increase in the complexity of the production process. Specifically, for example, the time required for forming the groove of the oxidation-resistant structure by etching may be increased. The prolonged etching time results in an increase in the thickness of resist required. Furthermore, it may become difficult to remove resist that remains in the wide groove of the oxidation-resistant structure in an photolithography step subsequent to formation of the groove of the oxidation-resistant structure.

Thus, in the first exemplary embodiment, an oxidation-resistant structure in which a groove is formed inside a portion surrounded by the dicing region and the surface of the groove is subjected to an oxidation-resistant treatment is employed. That is, the oxidation-resistant structure 60 according to the first exemplary embodiment is formed along the edge surfaces of each VCSEL device, which is separated from one another by dicing, namely, edge surfaces ES and inside a portion surrounded by the edge surfaces ES as illustrated in FIG. 1. The oxidation-resistant structure 60 includes, for example, an oxidation-resistant groove T2 that extends from the surface of the semiconductor layers to the n-type GaAs substrate 12 and a silicon oxynitride film 34 formed in the oxidation-resistant groove T2. In the first exemplary embodiment, the oxidation-resistant groove T2 is a peripheral groove that surrounds a portion of the VCSEL device 10 which includes the post P and the pad formation region PA.

As a result, the semiconductor layers of the VCSEL device 10 and, specifically, the side surfaces of the semiconductor layers, are protected by the silicon oxynitride film 34, which eliminates or reduces the risk that the semiconductor layers may be oxidized. In addition, when the oxidation-resistant structure 60 is employed, it is possible to form the oxidation-resistant groove T2 of the oxidation-resistant structure 60 independently of the dicing region. This limits an increase in the complexity of the process for producing the VCSEL device 10.

Figure 2A:
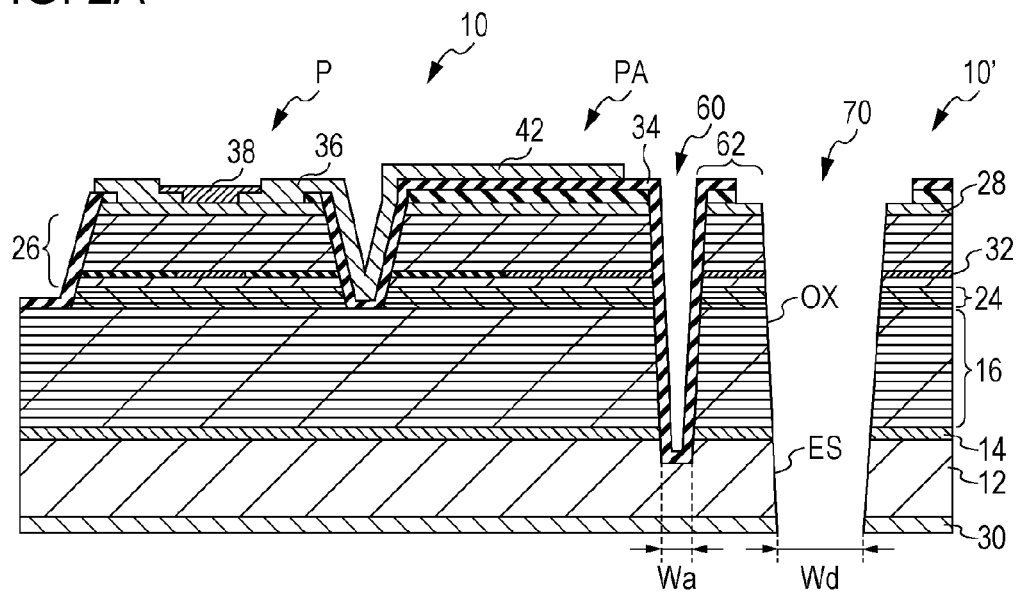
FIGS. 2A and 2B illustrate the relationship between an oxidation-resistant structure and a dicing region of a surface-emitting semiconductor laser device according to the first exemplary embodiment.
Figure 2B:
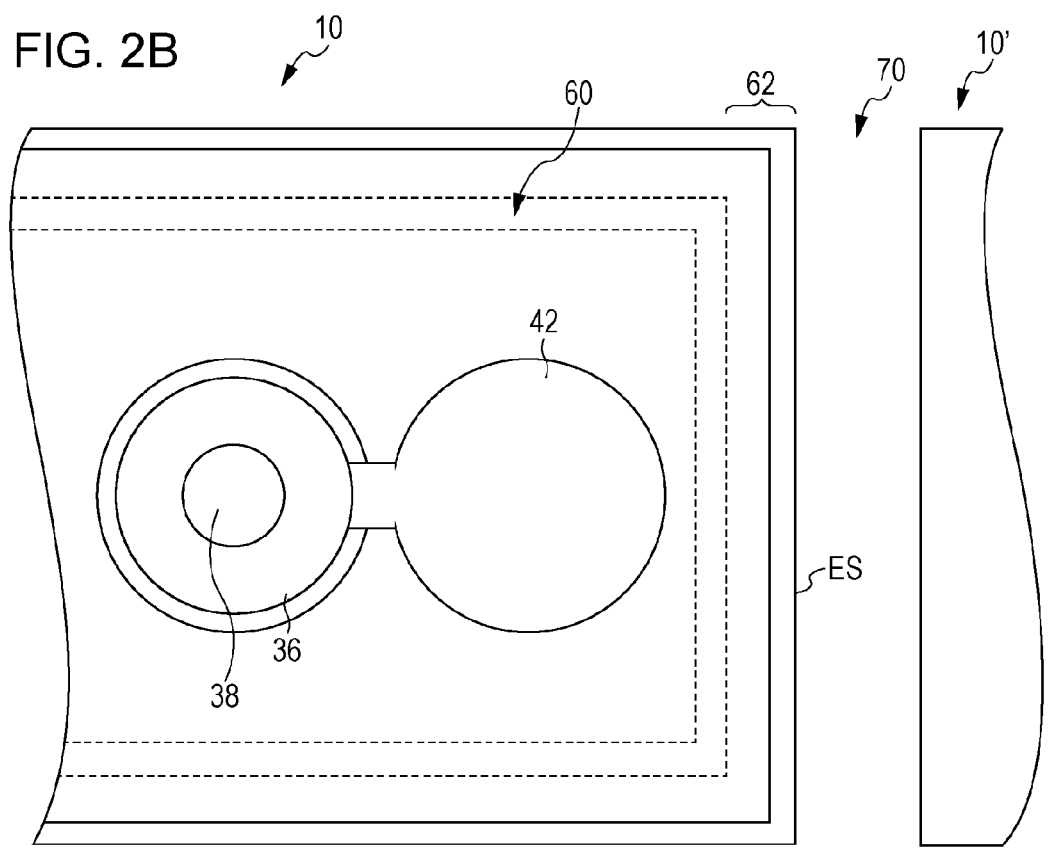

The function of the VCSEL device 10 according to the first exemplary embodiment is described further in detail below with reference to FIGS. 2A and 2B, which illustrate the VCSEL device 10, which has just been separated from other VCSEL devices by dicing after the steps for producing the wafer have been completed, together with a VCSEL device 10' adjacent to the VCSEL device 10. FIGS. 2A and 2B are a longitudinal sectional view and a plan view of the VCSEL device 10 and the VCSEL device 10', respectively.

As illustrated in FIGS. 2A and 2B, the oxidation-resistant structure 60 of the VCSEL device 10 is arranged along the dicing region 70 and inside a portion surrounded by the dicing region 70. The width Wa of the groove of the oxidation-resistant structure is set smaller than the width Wd of the dicing region. The width Wa of the groove of the oxidation-resistant structure is, for example, about 10 µm. The width Wd of the dicing region is, for example, 30 to 50 µm. The width of the oxidation sacrificial region 62 is, for example, 5 to 10 µm.

In FIG. 2A, a portion of the lower DBR 16 constituting the VCSEL device 10 is oxidized and, as a result, an oxidized region OX is formed. Thus, the edge surfaces ES may be oxidized after dicing. However, even when the edge surfaces ES are oxidized, the silicon oxynitride film 34, which protects the post P and the pad formation region PA of the VCSEL device 10, eliminates or reduces the risk that the oxidized region OX may reach the post P or the pad formation region PA. In other words, the expansion of the oxidized region in the VCSEL device 10 is suppressed in the oxidation sacrificial region 62, which eliminates or reduces the risk that the oxidized region OX may reach, specifically, the post P, which serves as a light-emitting portion.

FIG. 3 is a plan view of a wafer WAF prepared through the following steps for producing a VCSEL device. FIG. 3 illustrates a VCSEL array 10a as an example, which includes the VCSEL devices 10 according to the first exemplary embodiment which are arranged in an array.

The VCSEL array 10a includes the VCSEL devices 10 arranged in an array and electrode pads 42a disposed on the pad formation region PA. The electrode pads 42a are each connected to the corresponding one of the VCSEL devices 10 with a wire 44. Although FIG. 3 illustrates an example where 4×8=32 VCSEL devices 10 are arranged, the arrangement of the VCSEL devices 10 is not limited to this. The number of the VCSEL devices 10 may be selected as needed depending on the application and the like. While the VCSEL devices 10 are each connected to the corresponding one of the electrode pads 42a with the wire 44, FIG. 3 illustrates only one of the electrode pads 42a which is connected to the corresponding one of the VCSEL devices 10 with the wire 44.

As illustrated in FIG. 3, each VCSEL array 10a formed on the wafer WAF is separated from one another by the dicing region (i.e., separating region) 70. The oxidation sacrificial region 62 and the oxidation-resistant structure 60 are disposed on both sides of the dicing region 70. Although FIG. 3 illustrates an example where the oxidation-resistant structure 60 is arranged in the four sides of a rectangle along the dicing region 70, the arrangement of the oxidation-resistant structure 60 is not limited to this. The oxidation-resistant structure 60 may be arranged in at least one side of a rectangle along the dicing region 70 in consideration of the structure and the like of the VCSEL device 10.

An example method for producing the surface-emitting semiconductor laser device 10 according to the first exemplary embodiment is described below with reference to FIGS. 4A to 7C. Since FIGS. 4A to 7C illustrate production steps starting with an epitaxially grown wafer WAF, initially, a method for producing the epitaxially grown wafer WAF illustrated in FIG. 4A is described below.

Figure 4A:
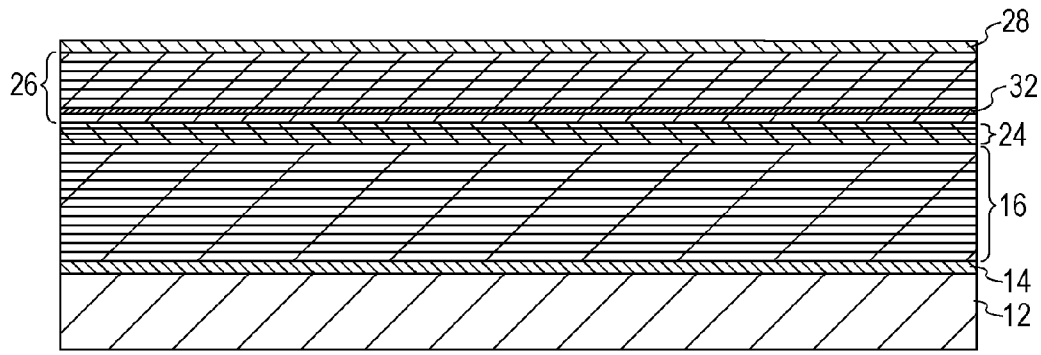
FIGS. 4A to 7C are longitudinal sectional views of a surface-emitting semiconductor laser device according to the exemplary embodiment, illustrating an example method for producing the surface-emitting semiconductor laser device.

As illustrated in FIG. 4A, an n-type GaAs buffer layer 14 having a carrier concentration of about $2 \times 10^{18}$ cm$^{-3}$ and a thickness of about 500 nm is formed on an n-type GaAs substrate 12 by metal organic vapor phase deposition (MOCVD) or the like.

An n-type lower DBR 16 including 37.5 periods of alternating pairs of an $Al_{0.3}Ga_{0.7}As$ layer and an $Al_{0.9}Ga_{0.1}As$ layer is formed on the n-type GaAs buffer layer 14. The thicknesses of the $Al_{0.3}Ga_{0.7}As$ layer and the $Al_{0.9}Ga_{0.1}As$ layer are set equal to a quarter of the wavelength in the medium λ/n. The carrier concentrations in the $Al_{0.3}Ga_{0.7}As$ layer and the $Al_{0.9}Ga_{0.1}As$ layer are set to about $2 \times 10^{18}$ cm$^{-3}$. The overall thickness of the lower DBR 16 is set to about 4 µm.

An active region 24 including a nondoped $Al_{0.6}Ga_{0.4}As$ layer serving as a lower spacer layer, a nondoped quantum well active layer, and a nondoped $Al_{0.6}Ga_{0.4}As$ layer serving as an upper spacer layer is formed on the lower DBR 16. The quantum well active layer includes four $Al_{0.3}Ga_{0.7}As$ layers serving as barrier layers and three $Al_{0.11}Ga_{0.89}As$ layers serving as quantum well layers which are each interposed between the corresponding pairs of the barrier layers. The thickness of the $Al_{0.3}Ga_{0.7}As$ barrier layers is set to about 5 nm. The thickness of the $Al_{0.11}Ga_{0.89}As$ quantum well layers is set to about 9 nm. The overall thickness of the active region 24 is set equal to the wavelength in the medium λ/n.

A p-type AlAs layer 32 is formed on the upper spacer layer. A p-type upper DBR 26 including 25 periods of alternating pairs of an $Al_{0.3}Ga_{0.7}As$ layer and an $Al_{0.9}Ga_{0.1}As$ layer is formed on the AlAs layer 32. The thicknesses of the $Al_{0.3}Ga_{0.7}As$ layer and the $Al_{0.9}Ga_{0.1}As$ layer are set equal to a quarter of the wavelength in the medium λ/n. The carrier concentrations in the $Al_{0.3}Ga_{0.7}As$ layers and the $Al_{0.9}Ga_{0.1}As$ layers are set to about $2 \times 10^{18}$ cm$^{-3}$. The overall thickness of the upper DBR 26 is set to about 3 µm. A p-type GaAs contact layer 28 having a carrier concentration of about $1 \times 10^{19}$ cm$^{-3}$ and a thickness of about 10 nm is formed on the upper DBR 26.

Examples of materials used in the above-described production method include trimethylgallium, trimethylaluminium, and arsine. An example of the n-type dopant is disilane. An example of the p-type dopant is carbon tetrabromide. The substrate temperature is set to about 700° C. during growth. Growth is continuously performed under a reduced pressure while different materials are successively charged. Optionally, a composition-inclination region having a thickness of about 20 nm in which the Al content is gradually changed may be interposed between each pair of the layers constituting the lower DBR or the upper DBR in order to reduce the electric resistance of the lower DBR or the upper DBR.

The remaining steps of the method for producing the VCSEL device 10 according to the first exemplary embodiment which are conducted subsequent to the epitaxial growth step are described below.

Figure 4B:
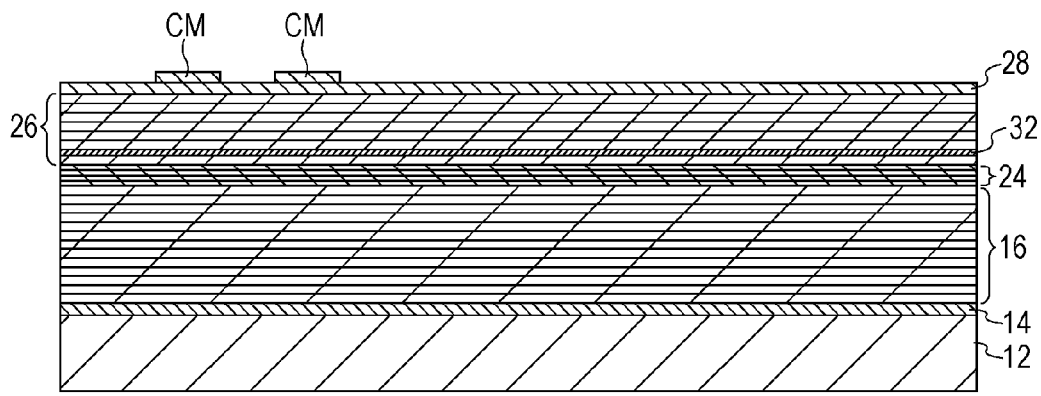

An electrode material is deposited on the p-type GaAs contact layer 28 formed on the epitaxially grown wafer WAF. A portion of the deposited electrode material is removed by, for example, etching using a mask formed by photolithography. Thus, a contact metal (CM) to which a p-type electrode 36 is to be attached is formed as illustrated in FIG. 4B. The contact metal CM is, for example, a titanium (Ti)/gold (Au) laminated film.

Figure 4C:
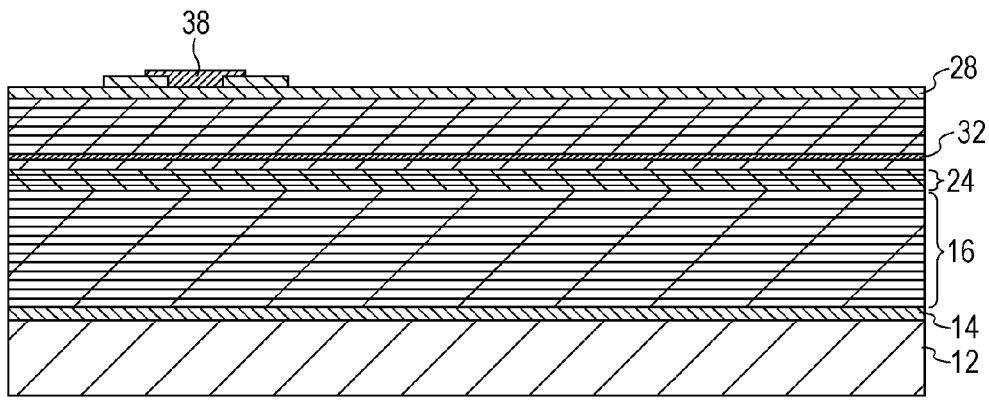

A material to be formed into an emission protection film is deposited on the surface of the wafer WAF. A portion of the deposited material is removed by, for example, etching using a mask formed by photolithography. Thus, an emission protection film 38 is formed as illustrated in FIG. 4C. The emission protection film is, for example, a SiN film.

Figure 5A:
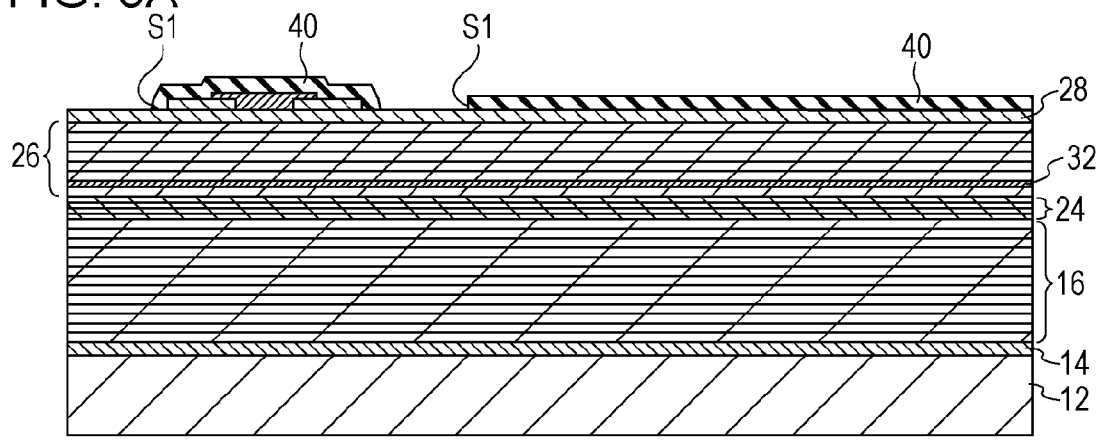

A mask material is deposited on the surface of the wafer WAF. The deposited mask material is etched by, for example, photolithography. Thus, a mask used for forming a post P is formed as illustrated in FIG. 5A. The mask may be, for example, a silicon nitride film, and the mask is illustrated as a silicon nitride film 40 in FIG. 5A. A slit S1 used for forming the post P by etching is formed in the mask.

Figure 5B:
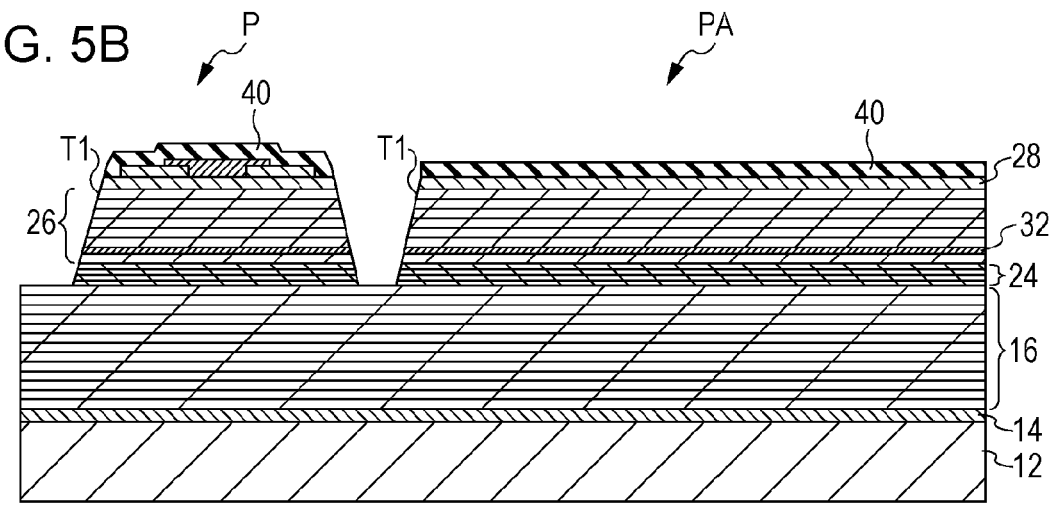

Subsequently, a portion of the wafer WAF is removed by etching to form a groove T1. Thus, a mesa-like post P is formed as illustrated in FIG. 5B. The remaining portion of the wafer WAF other than the post P which is separated by the groove T1 serves as a pad formation region PA.

Figure 5C:
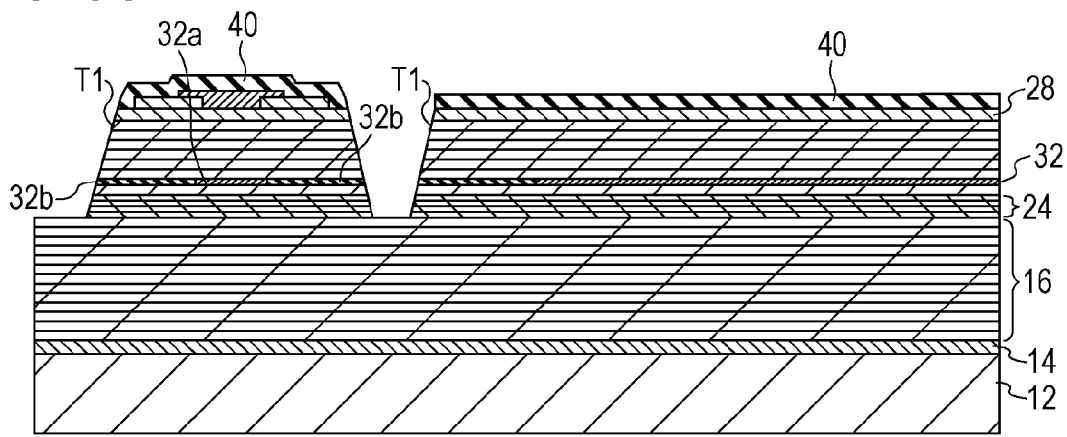

The wafer WAF is subjected to an oxidation treatment in order to oxidize the AlAs layer 32 from the side surfaces. Thus, an oxidation confinement layer is formed inside the post P as illustrated in FIG. 5C. The oxidation confinement layer includes a current injection region 32a and a selective oxidation region 32b. The selective oxidation region 32b is the region oxidized through the oxidation treatment, and the remaining region that is not oxidized serves as the current injection region 32a. The current injection region 32a has a circular shape or a substantially circular shape. A current that passes between the p-type electrode 36 and the n-type electrode 30 of the VCSEL device 10 is concentrated through the current injection region 32a, which enables, for example, the transverse mode of laser oscillation of the VCSEL device 10 to be controlled.

Figure 6A:
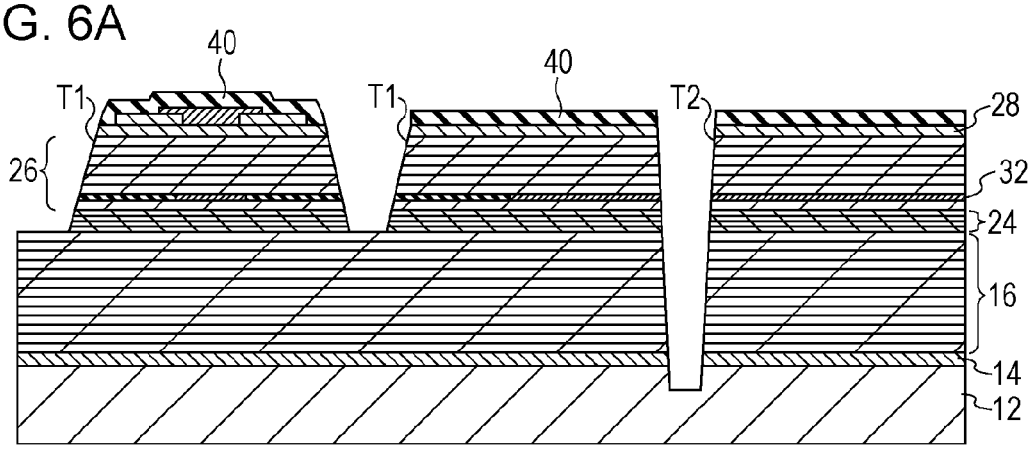

An oxidation-resistant groove T2 is formed as illustrated in FIG. 6A by, for example, etching using a mask formed by photolithography. In the first exemplary embodiment, a method in which the groove T1 and the oxidation-resistant groove T2 are each formed by the individual etching process is described as an example. However, the method for forming the groove T1 and the oxidation-resistant groove T2 is not limited to this. For example, the groove T1 and the oxidation-resistant groove T2 may be formed at once by a single etching process. In the first exemplary embodiment, the width of the oxidation-resistant groove T2 is set smaller than that of the dicing slit S2 described below.

Figure 6B:
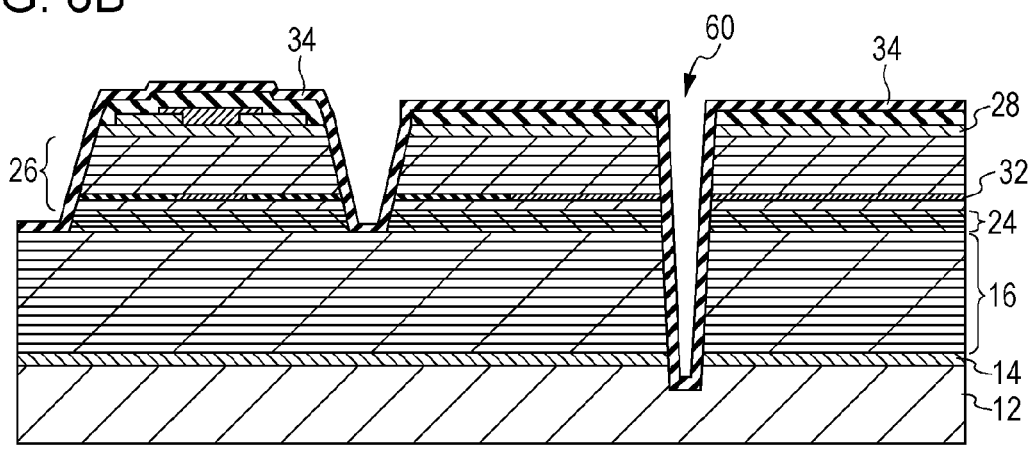

A silicon oxynitride film 34 serving as an insulating film is deposited over the entire surface of the wafer WAF as illustrated in FIG. 6B. In this step, the oxidation-resistant structure 60 according to the first exemplary embodiment, in which the side surfaces of the semiconductor layers are covered with the insulating film, is formed.

Figure 6C:
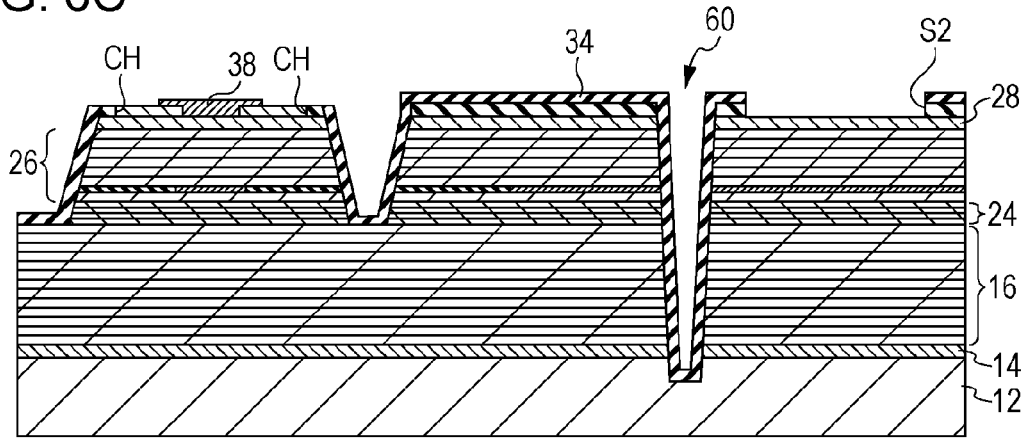

A contact hole CH and a dicing slit S2 are formed in the silicon oxynitride film 34 as illustrated in FIG. 6C by, for example, etching using a mask formed by photolithography. The contact hole CH is an opening through which the contact metal CM is connected to the p-type electrode 36 described below. The dicing slit S2 is an opening used for forming the dicing region 70 described below. The protection films, that is, the silicon nitride film 40 and the silicon oxynitride film 34, are absent in the dicing slit S2.

Figure 7A:
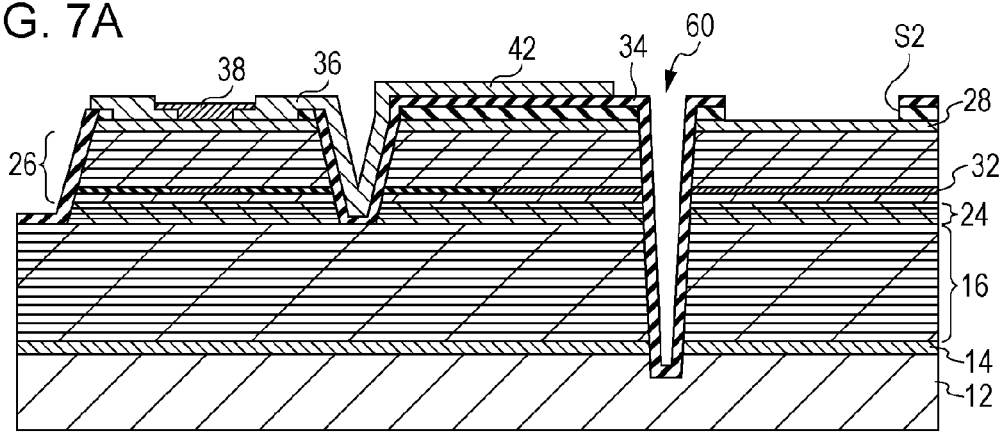

An electrode material is deposited on the surface of the wafer WAF. A portion of the deposited electrode material is removed by, for example, etching using a mask formed by photolithography. Thus, a p-type electrode 36 and an electrode pad 42 are formed as illustrated in FIG. 7A. The p-type electrode 36 and the electrode pad 42 are, for example, a titanium (Ti)/gold (Au) laminated film. In this step, the p-type electrode 36 is connected to the above-described contact metal CM.

Figure 7B:
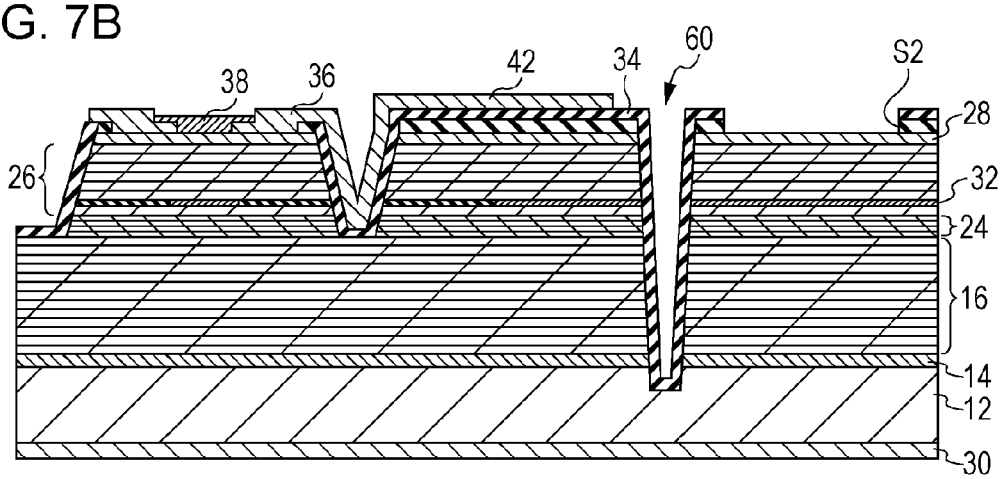

An electrode material is deposited on the rear surface of the wafer WAF as illustrated in FIG. 7B to form an n-type electrode 30. The n-type electrode 30 is formed by, for example, depositing an AuGe/Au laminated film.

Figure 7C:
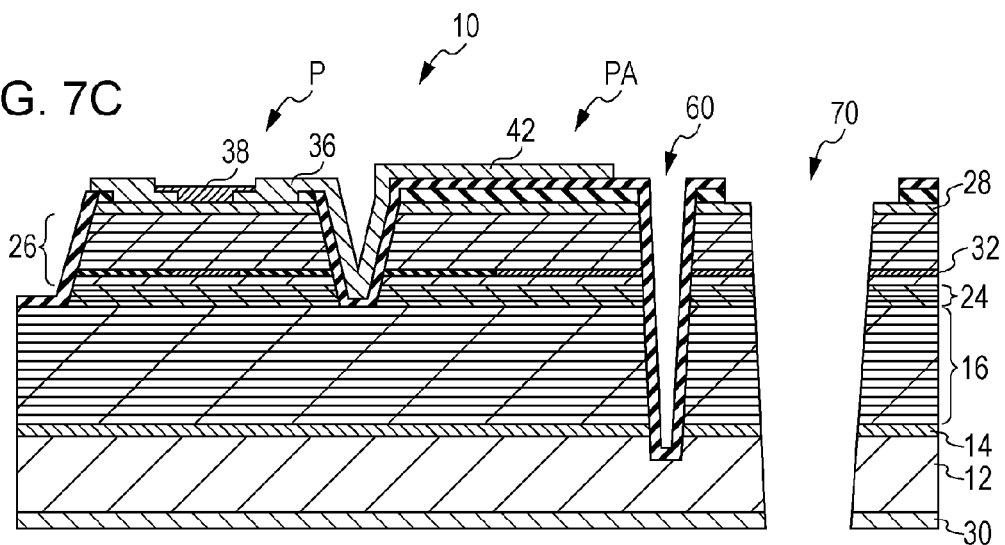

The VCSEL device 10 is separated from the other VCSEL devices as illustrated in FIG. 7C by dicing along the dicing region 70. The VCSEL device 10 is produced by the above-described process. In the first exemplary embodiment, a method for producing the VCSEL device 10 is described as an example. It is also possible to produce the VCSEL array 10a by the above-described process.

Second Exemplary Embodiment

A VCSEL device 10b according to the second exemplary embodiment is described with reference to FIGS. 8A and 8B. The VCSEL device 10b according to the second exemplary embodiment is different from the VCSEL device 10 according to the first exemplary embodiment in that an oxidation-resistant slit S3 is formed in the VCSEL device 10b.

Even when the oxidation-resistant structure 60 is provided for protecting the post P, which serves as a light-emitting portion, as in the VCSEL device 10 according to the first exemplary embodiment, peeling of an insulating film (e.g., silicon oxynitride film 34) may occur due to oxidation of a portion of the semiconductor layers. Moreover, peeling of an insulating film may result in breaking of metal wires (e.g., electrode pad 42).

Figure 8A:
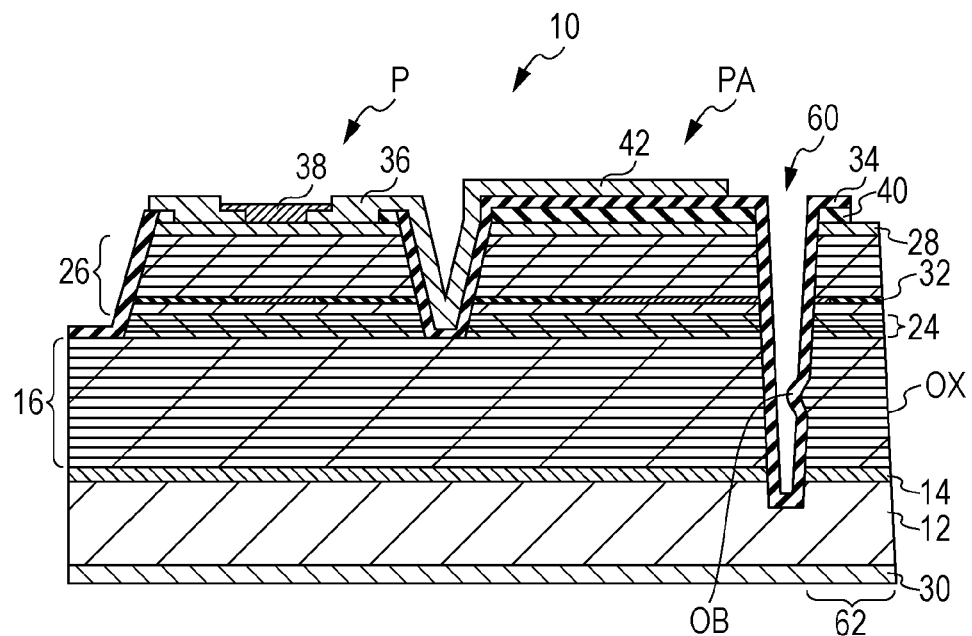
FIGS. 8A and 8B are longitudinal sectional views of examples of a surface-emitting semiconductor laser device according to the second exemplary embodiment.

FIG. 8A illustrates an example where an oxidized region OX is formed due to oxidation of a part of the oxidation sacrificial region 62 which corresponds to the lower DBR 16 and consequently peeling of the silicon oxynitride film 34, that is, an obstruction OB, occurs. If the obstruction OB extends toward the pad formation region PA, peeling of the electrode pad 42 and the silicon oxynitride film 34 in the pad formation region PA (or, in post P) may be caused to occur. The VCSEL device 10b according to the second exemplary embodiment is capable of addressing the above-described issues.

Figure 8B:
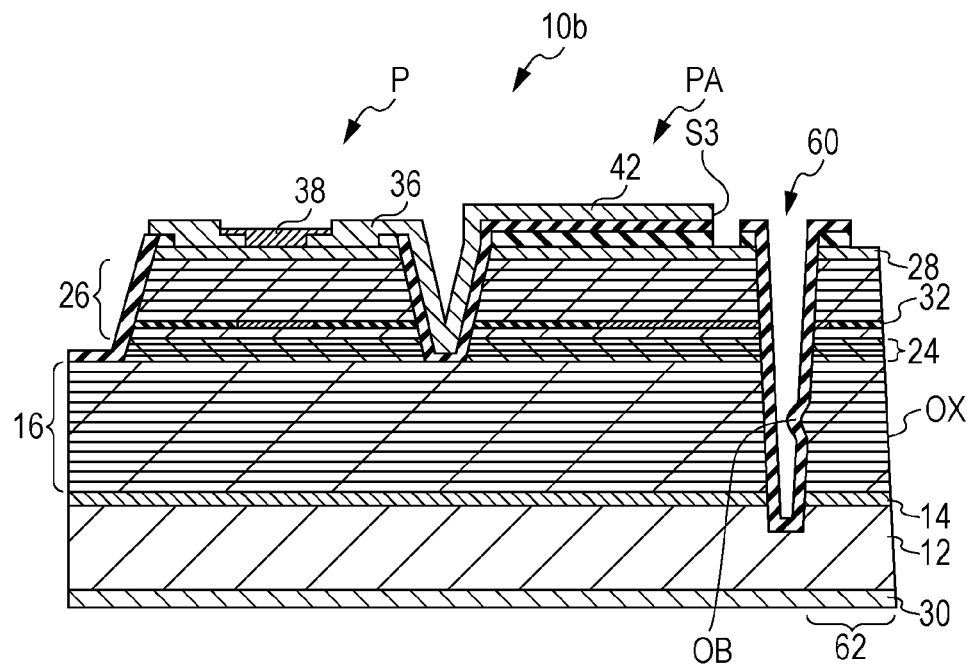

FIG. 8B illustrates the VCSEL device 10b according to the second exemplary embodiment. As illustrated in FIG. 8B, an oxidation-resistant slit S3 is formed in the VCSEL device 10b such that the insulating film is cut between the pad formation region PA and the oxidation-resistant structure 60 by the oxidation-resistant slit S3. Even when the obstruction OB occurs, the oxidation-resistant slit S3 enables the obstruction OB and the pad formation region PA (or the post P) to be separated from each other. Thus, even if the obstruction OB is formed, the risk that the obstruction OB may cause secondary obstruction to the pad formation region PA (or the post P) may be eliminated or reduced.

The above-described oxidation-resistant slit S3 may be formed by an individual etching process or may alternatively be formed at a time during the etching process for forming the contact hole CH and the dicing slit S2 illustrated in FIG. 6C. In such a case, one etching process is conducted for multiple purposes, which eliminates the need to increase the number of production steps.

The oxidation-resistant slit S3 may be arranged so as to surround the VCSEL device 10b (i.e., the post P and the pad formation region PA) along the oxidation-resistant structure 60 or may alternatively be arranged partially in consideration of positions at which oxidation is to be avoided.

In the first and second exemplary embodiments, an oxidation-resistant structure 60 in which an insulating film (in the above-described exemplary embodiments, silicon oxynitride film 34) is formed in the oxidation-resistant groove T2 is described as an example. However, the structure of the oxidation-resistant structure 60 is not limited to this. The semiconductor layers may be covered with a metal film or an oxide film instead of an insulating film. Alternatively, ions of a predetermined element may be injected. In another case, another semiconductor layer may be regrown.

In the above-described exemplary embodiments, an example where the oxidation-resistant groove T2 is formed so as to reach the n-type GaAs substrate 12 is described as an example. However, the structure of the oxidation-resistant groove T2 is not limited to this. In consideration of, for example, the position at which oxidation is to be avoided, the oxidation-resistant groove T2 may be formed so as to reach, for example, the upper DBR 26 or may alternatively be formed so as to reach the AlAs layer (i.e., oxidation confinement layer) 32.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A surface-emitting semiconductor laser device comprising:
   a substrate;
   a semiconductor layer formed on the substrate, the semiconductor layer including:
      a first semiconductor multilayer film of a first conductivity type;
      an active region; and
      a second semiconductor multilayer film of a second conductivity type,
      the first semiconductor multilayer film and the second semiconductor multilayer film forming a cavity; and
   an oxidation-resistant structure including a groove formed along at least a portion of an outer periphery of the semiconductor layer and an oxidation-resistant portion formed on a surface of the groove,
   wherein the groove is formed at an inner side of the portion of the outer periphery of the semiconductor layer.

2. The surface-emitting semiconductor laser device according to claim 1,
   wherein the oxidation-resistant portion is an insulating film formed in the groove.

3. The surface-emitting semiconductor laser device according to claim 2, further comprising:
   one or more mesa-like light-emitting portions defined by the groove formed in the semiconductor layer,
   wherein the groove is formed between the one or more light-emitting portions and the outer periphery, and
   wherein the insulating film forms a part of an insulating film formed in a region extending from a side surface of the one or more light-emitting portions to the outer periphery.

4. The surface-emitting semiconductor laser device according to claim 3,
   wherein at least a portion of the insulating film has a gap formed between the one or more light-emitting portions and the oxidation-resistant structure.

5. The surface-emitting semiconductor laser device according to claim 3, further comprising:
   one or more electrode pads disposed between the one or more light-emitting portions and the groove, the one or more electrode pads being each connected to a corresponding one of the one or more light-emitting portions.

6. The surface-emitting semiconductor laser device according to claim 1,
   wherein the oxidation-resistant portion is any one of a metal film, an oxide film, a semiconductor layer, and an ion injection region that are formed in the groove.

7. The surface-emitting semiconductor laser device according to claim 1,
   wherein the groove is formed so as to reach the substrate.

8. The surface-emitting semiconductor laser device according to claim 1,
   wherein the groove is formed along an entirety of the outer periphery.

9. The surface-emitting semiconductor laser device according to claim 1, wherein the portion of the outer periphery of the semiconductor layer is surrounded by a dicing region.

10. The surface-emitting semiconductor laser device according to claim 9, wherein the groove does not overlap with the dicing region.

11. The surface-emitting semiconductor laser device according to claim 10, wherein the groove does not overlap with any dicing regions.

12. The surface-emitting semiconductor laser device according to claim 1, further comprising an oxidation sacrificial region.

13. The surface-emitting semiconductor laser device according to claim 12, wherein the oxidation sacrificial region is formed between the groove and the portion of the outer periphery of the semiconductor layer.

14. The surface-emitting semiconductor laser device according to claim 9, wherein a width of the groove is less than a width of the dicing region.

15. The surface-emitting semiconductor laser device according to claim 1, wherein a width of the groove is about 10 μm.

* * * * *